United States Patent [19]

Nakajima

[11] Patent Number: 5,763,290
[45] Date of Patent: Jun. 9, 1998

[54] METHOD OF FABRICATING SEMICONDUCTOR LASER

[75] Inventor: Yasuo Nakajima, Itami, Japan

[73] Assignee: Mitsubishi Denki Kabushiki Kaisha, Tokyo, Japan

[21] Appl. No.: 563,125

[22] Filed: Nov. 29, 1995

[30] Foreign Application Priority Data

Feb. 15, 1995 [JP] Japan ................. 7-026368

[51] Int. Cl.$^6$ .................................................. H01L 21/20
[52] U.S. Cl. ..................................... 438/33; 66/460
[58] Field of Search .......................... 438/460, 462, 438/16, 32, 31, 33, 66, 68, 29, 386, 973, 409; 148/DIG. 28; 378/73; 356/31

[56] References Cited

U.S. PATENT DOCUMENTS

| | | | |
|---|---|---|---|
| 4,371,966 | 2/1983 | Scifres et al. | 372/45 |
| 4,542,511 | 9/1985 | Goodfellow et al. | 372/46 |
| 4,755,314 | 7/1988 | Sakaguchi et al. | 252/62.9 |
| 5,060,043 | 10/1991 | Yasse | 438/973 |
| 5,187,729 | 2/1993 | Ibe et al. | 378/73 |
| 5,227,339 | 7/1993 | Kishii | 438/460 |
| 5,279,077 | 1/1994 | Miyashita et al. | 51/283 |
| 5,284,792 | 2/1994 | Forster et al. | 437/129 |
| 5,402,239 | 3/1995 | Ishii et al. | 356/387 |
| 5,677,565 | 10/1997 | Funaba | 257/620 |

FOREIGN PATENT DOCUMENTS 1196891  8/1989  Japan .

OTHER PUBLICATIONS

W.J. Bartels "Characterization of Thin Layers on Perfect Crystals with a Multipurpose High Resolution X-Ray Diffractometry," Journal of Vacuum Science Technology B1(2) Apr.–Jun. 1983 pp. 338–345.

Zah et al., "High–Speed 1.3 μm GaInAsP p–Substrate Buried–Crescent Lasers With Semi–Insulating Fe/Ti–Doped InP Current Blocking Layers", Electronics Letters, vol. 24, No. 11, 1988 pp.695–697.

Tanahashi et al., "Liquid Phase Epitaxial Growth Of Fe–Doped Semi–Insulating InP, GaInAsP, amd AlGaInAs", Fujitsu Science Technical Journal, vol. 24, No. 3, 1988, pp. 242–253.

Aoki et al., "High–Speed (10Gbit/s) And Low–Drive–Voltage (1 V Peak To Peak) InGaAs/InGaAsP MQW Electroabsorption–Modulator Integrated DFB Laser With Semi–Insulating Buried Heterostructure", Electronics Letters, vol. 28, No. 12, 1992, pp. 1157–1158.

Aoki et al., "InGaAs/InGaAsP MQW Electroabsorption Modulator Integrated With A DFB Laser Fabricated By Band–Gap Energy Control Selective Area MOCVD", IEEE Journal of Quantum Electronics, vol. 29, No. 6, 1993, pp. 2088–2096.

Oberg et al., "Increased Modulation Bandwidth Up To 20 GHz Of A Detuned–Loaded DBR Laser", IEEE Photonics Technology Letters, vol. 6, No. 2, 1994, pp. 161–163.

*Primary Examiner*—John Niebling
*Assistant Examiner*—S. Mulpuri
*Attorney, Agent, or Firm*—Leydig, Voit & Mayer, Ltd.

[57] ABSTRACT

In a method of fabricating semiconductor laser chips using a circular semiconductor wafer, an orientation flat is formed at a part of the peripheral side surface of the semiconductor wafer so that an alignment error of the orientation flat from a crystalline axis of the semiconductor wafer is within±0.04°. Therefore, the processing precision in fabricating semiconductor laser chips using the circular wafer is improved.

7 Claims, 9 Drawing Sheets

METHOD OF FABRICATING SEMICONDUCTOR LASER

FIELD OF THE INVENTION

The present invention relates to a method of fabricating semiconductor laser chips used for optical communication and information processing and, more particularly, to a method of fabricating semiconductor laser chips employing a circular semiconductor wafer.

BACKGROUND OF THE INVENTION

Generally, semiconductor laser chips are fabricated in process steps described hereinafter. FIGS. 6(a)–6(c) show conventional semiconductor wafers. More specifically, FIG. 6(a) is a plan view of a circular semiconductor wafer, FIG. 6(b) is a perspective view of a rectangular semiconductor wafer with orientations, and FIG. 6(c) is a perspective view of the circular wafer shown in FIG. 6(a) with orientations.

FIGS. 7(a)–7(d) are sectional views illustrating process steps in a method of fabricating a semiconductor laser structure for a single laser chip, FIG. 7(e) is a perspective view illustrating laser chips after a first cleaving step, and FIG. 7(f) is a perspective view illustrating a laser chip after a second cleaving step, i.e., an isolated laser chip. FIG. 8 shows an electrode pattern formed on a wafer. In FIGS. 6(a)–6(c), reference numeral 1 designates a circular semiconductor wafer, numeral 100 designates a rectangular semiconductor wafer, numeral 2 designates an orientation flat, numerals 1a and 1b designate directions in which etching proceeds in the wafer. In FIGS. 7(a)–7(d), reference numeral 11 designates an active layer, numeral 21 designates an optical waveguide, numeral 31 designates a current blocking structure, numeral 41 designates a contact layer, numeral 51a designates a surface electrode, numeral 51b designates a rear electrode, and numeral 61 designates a crystal plane along which a first cleaving step is performed. In FIG. 8, reference numeral 51 designates an electrode pattern and reference numeral 81 designates a space between electrodes.

A description is given of the fabricating method.

Initially, on a rectangular wafer of a semiconductor, such as InP or GaAs, as shown in FIG. 6(b), an active layer 11 having a double heterojunction structure is fabricated by liquid phase epitaxy (FIG. 7(a)). Then, an optical waveguide 21 for propagating light is produced using photolithography and etching techniques (FIG. 7(b)). In the step of FIG. 7(c), a current blocking structure 31 and a contact layer 41 are grown by liquid phase epitaxy. Thereafter, a surface electrode 51a and a rear electrode 51b are formed on the contact layer 41 and the rear surface of the substrate 1, respectively (FIG. 7(d)). In the step of FIG. 7(e), the semiconductor wafer including the laser structure fabricated as described above is divided into a plurality of bars. FIG. 7(e) shows one of the bars. More specifically, the wafer is cleaved at crystal planes 61 that are perpendicular to the longitudinal direction of the optical waveguides 21 in the wafer, whereby opposite ends of the optical waveguide 21 in each laser chip are produced. Finally, the bar is divided into individual semiconductor laser chips as shown in FIG. 7(f).

In the prior art method for fabricating semiconductor laser chips, liquid phase epitaxy is usually used for fabrication of the laser structure, and the shape of the semiconductor wafer is restricted to a rectangle as shown in FIG. 6(b) because of the shape of a boat for crystal growth used in the liquid phase growth method. The rectangular wafer is produced by spontaneous cleaving of a circular wafer.

In the fabrication of semiconductor laser chips, since the chip separation is performed by cleaving, the crystal orientation of the semiconductor and the orientation of the mask pattern must be aligned with high accuracy.

In case of the rectangular wafer shown in FIG. 6(b), since the mask pattern is adjusted parallel to the cleavage plane in the step of photolithography, the orientation error of the mask pattern 51 from the crystal plane 61 along which the wafer is cleaved as shown in FIG. 8 is reduced.

In case of the circular wafer shown in FIG. 6(a), an orientation flat 2 for alignment is formed at a prescribed part of the periphery of the circular wafer. This orientation flat 2 is mechanically formed by grinding or polishing. The precision of the orientation flat with respect to a crystal axis exceeds ±0.5°. This precision is sufficient in the fabrication of LSIs in which chip separation is performed with a dicer or the like. However, in the fabrication of semiconductor laser chips, this deviation in the precision of the orientation flat results in fatal damage.

Meanwhile, Japanese Published Patent Application No. Hei. 1-196891 discloses a method of fabricating semiconductor laser chips in which an orientation flat of a circular wafer is formed by cleaving in order to reduce the orientation error of the mask pattern relative to a crystal plane.

In recent years, vapor phase growth, such as MOCVD (Metal Organic Chemical Vapor Deposition), has been employed for crystal growth of semiconductor laser structures. In this case, a circular semiconductor wafer as shown in FIG. 6(a), such as a silicon wafer used for LSIs, can be employed. As the vapor phase growth technique for fabricating semiconductor lasers has been put to practical use, automated production line systems used for fabrication of LSIs can be used for fabrication of semiconductor lasers, whereby a significant improvement in processing precision and productivity is expected.

However, in a circular wafer having an orientation flat which is formed with the same precision as the conventional silicon wafer, the error of the orientation flat from the crystal axis exceeds ±0.5°, and a circular wafer with such a poor precision cannot be used for fabrication of semiconductor lasers. That is, since, in the case of LSIS, a plurality of chips fabricated in a wafer are divided with a dicer or the like, it is not necessary to accurately align the chip pattern with the crystal axis, so that the precision of the orientation flat to the crystal axis exceeding ±0.5° is quite enough. In case of semiconductor lasers, however, a plurality of chips fabricated in a wafer are divided by cleaving as shown in FIGS. 7(e) and 7(f), and a resonator of each laser chip is produced with the crystal plane 61 as a mirror facet. Therefore, an orientation error of the electrode pattern 51 from the crystal plane 61 as shown in FIG. 8 causes fatal defects of the laser device, such as destruction of the laser, reduction in the precision of the resonator, and deviation of laser beams.

The above-described Japanese Published Patent Application No. Hei. 1-196891 discloses a method of fabricating semiconductor laser chips using a circular wafer in which an orientation flat used for alignment of a mask pattern is formed by spontaneous cleaving. However, when the orientation flat of the circular wafer is formed by spontaneous cleaving, although the orientation error of the mask pattern is reduced, it is very difficult to make the orientation flat a desired length. The reason is as follows. When the orientation flat is formed by cleaving, a scratch is formed in the wafer along a crystal plane using a diamond scriber or the like, and the wafer is cleaved by applying force. Since this work is performed manually, the yield is poor and the orientation flat becomes about 1.5 times as long as the orientation flat formed by machine work and has an error from the crystal axis exceeding ±0.5°. For example, in a 2-inch InP wafer, a 16 mm long orientation flat is formed by machine work. However, when an orientation flat is formed by spontaneous cleaving, the length of the orientation flat is inevitably as long as 24 mm because the scratch formed in the wafer with the diamond scriber is close to the tangent of the circular wafer and a sufficient space between the scratch and the tangent of the circular wafer cannot be secured.

When a circular wafer with such a long orientation flat is mounted on a wafer carrier in an automatic processing apparatus, the center of the wafer is deviated and the wafer falls from the carrier.

On the other hand, an orientation flat detector shown in FIG. 9(a) in which an orientation flat is detected by mechanical pressure is generally employed. If the mechanical pressure is repeated on an orientation flat formed by spontaneous cleaving, chipping 71 occurs at the orientation flat as shown in FIG. 9(b). Especially a compound semiconductor substrate, such as InP and GaAs, employed for semiconductor lasers is very easily cracked along a crystal plane as compared to an Si substrate. Therefore, the chipping 71 causes cleaving of the wafer, whereby the wafer is unfavorably cracked.

Furthermore, in a circular wafer, for distinguishing between front and rear surfaces of the wafer, a second orientation flat shorter than the orientation flat for mask alignment (hereinafter referred to as first orientation flat) is formed at a position perpendicular to the first orientation flat. However, if the orientation flats are long as described above, it is difficult to distinguish the first orientation flat from the second orientation flat in detection of the orientation flats using mechanical pressure or non-contact detection using an optical system, resulting in malfunction of the detector.

SUMMARY OF THE INVENTION

An object of the present invention is to provide a method of fabricating highly precise and highly uniform semiconductor laser chips using a hardly cracked semiconductor wafer, with reduced orientation error of mask pattern relative to a crystal axis.

Other objects and advantages of the invention will become apparent from the detailed description that follows. The detailed description and specific embodiments described are provided only for illustration since various additions and modifications within the spirit and scope of the invention will be apparent to those of skill in the art from the detailed description.

According to a first aspect of the present invention, a method of fabricating semiconductor laser chips employs a circular semiconductor wafer having an orientation flat at a part of the peripheral side surface, wherein an error of the orientation flat from a crystal axis of the semicondutor wafer is within ±0.04°. Therefore, the processing precision in fabricating the semiconductor laser chips using the circular wafer is improved.

According to a second aspect of the present invention, the above-described method includes forming a mask pattern for semiconductor lasers on the circular semiconductor wafer so that an error of the mask pattern from the crystal axis is within ±0.06°; using the mask pattern, fabricating a plurality of semiconductor lasers in the circular semiconductor wafer; and dividing the circular semiconductor wafer into a plurality of individual semiconductor laser chips by cleaving the circular semiconductor wafer. Therefore, the processing precision in fabricating the semiconductor laser chips is improved. Further, when the wafer is divided into chips, unwanted cracking of the chip due to misorientation of the pattern is avoided.

According to a third aspect of the present invention, the above-described method includes forming the orientation flat of the semiconductor wafer by mechanically grinding or polishing a part of the peripheral side surface of the semiconductor wafer and adjusting with X-ray diffraction so that an error of the orientation flat from the crystal axis is within ±0.04°. Therefore, cracking of the wafer is reduced, and the processing precision in fabricating the semiconductor laser chips is improved.

According to a fourth aspect of the present invention, the above-described method includes forming the orientation flat of the semiconductor wafer by spontaneous cleaving; and chamfering an edge of the semiconductor wafer between the front surface and the peripheral side surface at the orientation flat using a mechanical or chemical method. Therefore, cracking of the wafer is reduced, and the processing precision in fabricating the semiconductor laser chips is improved.

According to a fifth aspect of the present invention, the above-described method includes using a circular semiconductor wafer comprising InP and having a diameter of 2 inches and a thickness in a range from 400 µm to 600 µm. Therefore, cracking of the wafer is reduced.

According to a sixth aspect of the present invention, the above-described method includes giving an identifying mark to the circular semiconductor wafer using a laser marker. Therefore, discrimination of the wafer from other wafers and discrimination between front and rear surfaces of the wafer are facilitated.

DETAILED DESCRIPTION OF THE PREFERRED EMBODIMENTS

Embodiment 1

Figure 1:
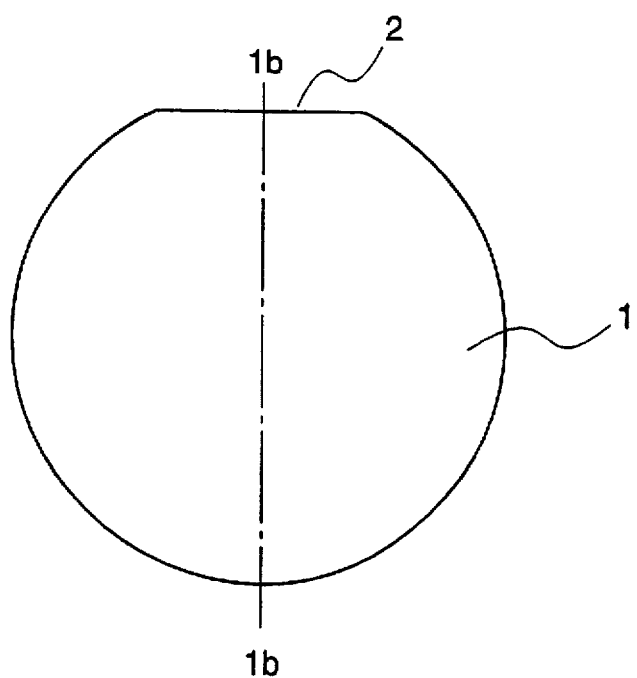
FIG. 1(a) is a plan view illustrating a wafer used for fabrication of semiconductor laser chips in accordance with a first embodiment of the present invention.
FIG. 1(b) is a part of a cross-sectional view taken along a line 1b—1b in FIG. 1(a).
Figure 1:
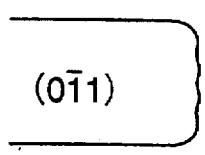

FIGS. 1(a) and 1(b) are diagrams for explaining a method of fabricating semiconductor laser chips in accordance with a first embodiment of the present invention, in which FIG. 1(a) is a plan view of a semiconductor wafer and FIG. 1(b) shows a part of a cross-sectional view taken along a line 1b—1b in FIG. 1(a). In these figures, reference numeral 1 designates a circular wafer comprising a semiconductor, such as InP or GaAs, and reference numeral 2 designates an orientation flat formed in the wafer 1. This orientation flat 2 is mechanically formed and precisely adjusted using X-ray diffraction so that the orientation error from the crystal plane ($0\bar{1}\bar{1}$) is within±0.02°.

Figure 2:
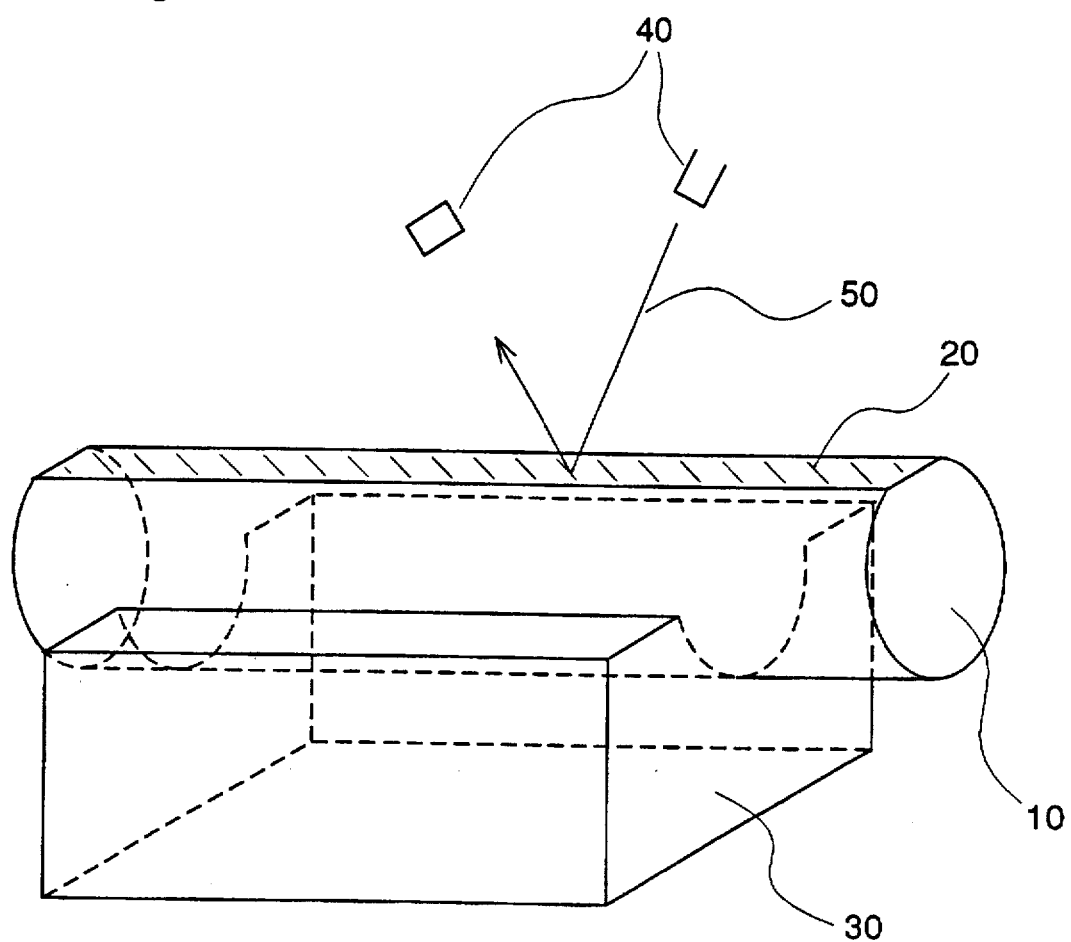
FIG. 2 is a perspective view illustrating an apparatus for fabricating semiconductor wafers according to the first embodiment of the present invention.

FIG. 2 is a perspective view illustrating an apparatus for producing the orientation flat. In the figure, reference numeral 10 designates a semiconductor ingot, such as InP or GaAs, numeral 20 designates an orientation flat mechanically formed by grinding or the like, numeral 30 designates a holder for the semiconductor ingot, and numeral 40 designates an X-ray diffraction apparatus emitting an X-ray 50.

First of all, a method of fabricating the semiconductor wafer shown in FIGS. 1(a)–1(b) will be described.

Figure 6:
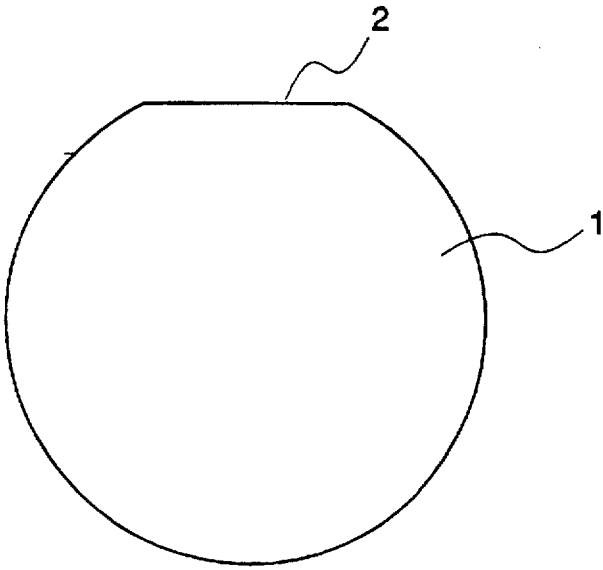
FIGS. 6(a) and 6(b) are a plan view and a perspective view illustrating a circular wafer and a rectangular wafer used for fabrication of semiconductor laser chips according to the prior art, respectively.
FIG. 6(c) is a perspective view illustrating crystal orientations of the circular wafer shown in FIG. 6(a).
Figure 6:
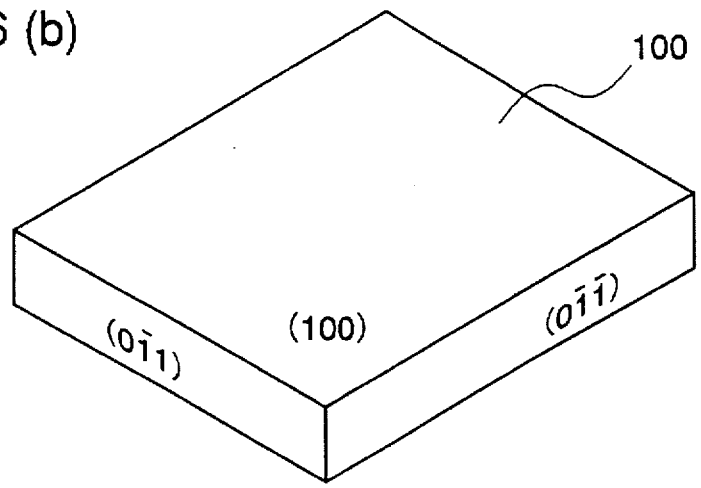
Figure 6:
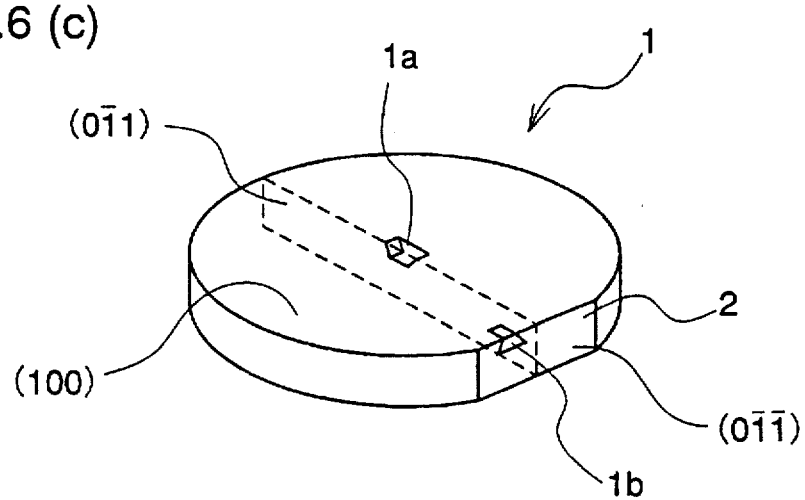
Figure 7:
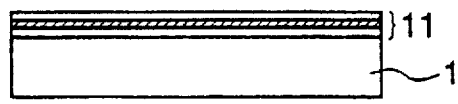
FIGS. 7(a)–7(f) are cross-sectional views and perspective views illustrating process steps in a method of fabricating semiconductor laser chips.
Figure 7:
Figure 7:
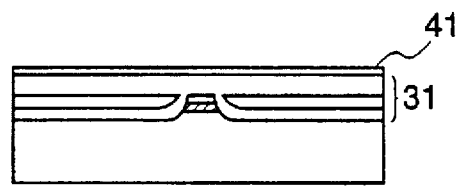
Figure 7:
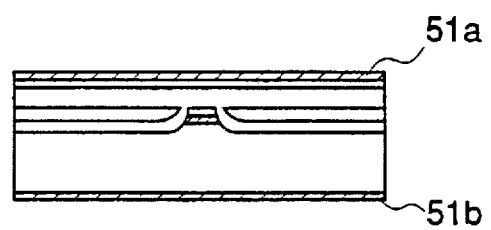
Figure 7:
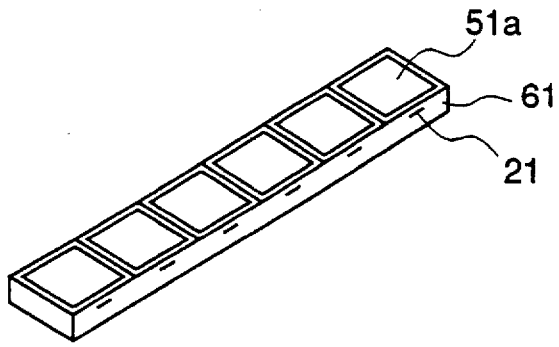
Figure 7:
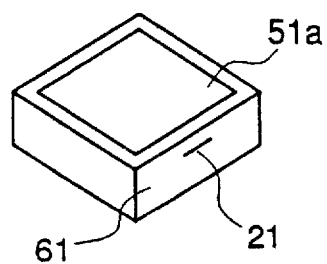
Figure 8:
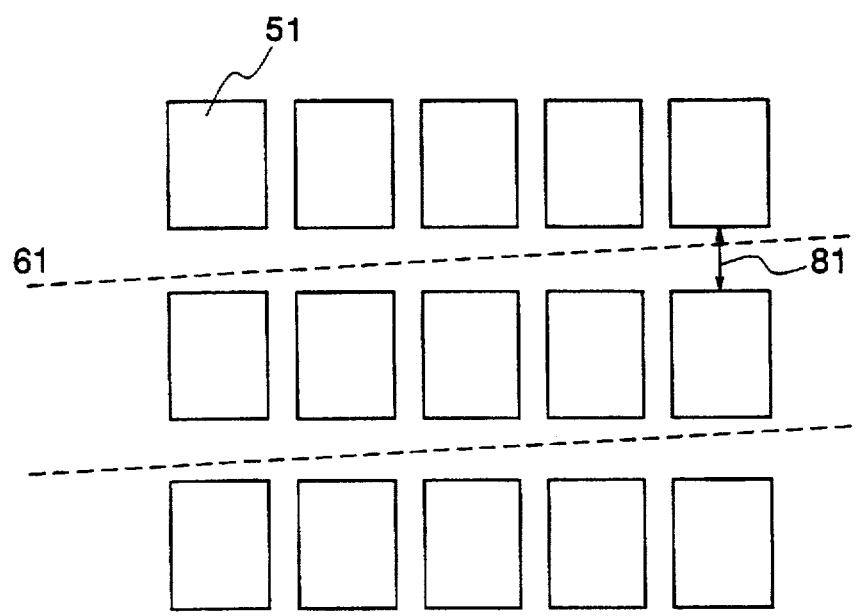
FIG. 8 is a plan view illustrating an electrode pattern on a semiconductor wafer.

In case of a semiconductor laser used for optical communication, a p or n type InP wafer is used, and the size of the wafer is 2 or 3 inches. In case of a 2-inch wafer, the length of the orientation flat is 16 mm. The surface orientation of the wafer is selected as shown in FIG. 6(c) for the necessity of cleaving. Initially, the semiconductor ingot 10 is fixed to the holder 30 as shown in FIG. 2, and a portion of the ingot 10 is ground or polished to form the orientation flat 20. In th is first embodiment, this orientation flat 20 is a little shorter than usual, i.e., it is about 10 mm for a 2-inch wafer. Then, this orientation flat 20 is irradiated with the X-ray 50 from the X-ray diffraction apparatus shown in FIG. 2, and the error of the orientation flat from the crystal axis is measured. Then, the measured error is adjusted and the orientation flat 20 is again ground and, thereafter, an error of the adjusted orientation flat 20 from the crystal axis is again measured by the X-ray diffraction. This operation is repeated until the length of the orientation flat reaches the usual length, i.e., 16 mm for a 2-inch wafer. Finally, the semiconductor ingot 10 is sliced and polished to produce a plurality of semiconductor wafers.

The adjustment of the orientation flat using X-ray diffraction may be performed for each semiconductor wafer after the semiconductor ingot is sliced into semiconductor wafers.

In the semiconductor wafer produced as described above, the error of the orientation flat 2 from the crystal plane ($0\bar{1}\bar{1}$) is within±0.02°, which means that the orientation flat 2 is formed with high precision. Since the orientation flat is mechanically formed by grinding or polishing, it is not completely flat but has slight unevenness as shown in FIG. 1(b). In addition, it has slightly rounded edges.

Using the semiconductor wafer 1 with the orientation flat 2 that is mechanically formed with high precision, semiconductor laser chips are-produced according to the same process flow as shown in FIGS. 7(a)–7(f). In this first embodiment, the respective semiconductor layers can be grown by vapor phase crystal growth.

Initially, an active layer 11 having a double heterojunction structure is grown on the semiconductor wafer 1 by vapor phase crystal growth. Then, an optical waveguide 21 for propagating light is produced using photolithography and etching techniques. A mask pattern for the optical waveguide 21 is adjusted using the orientation flat 2 as a reference. Then, current blocking structure 31 and a contact layer 41 are grown by vapor phase crystal growth and, thereafter, a surface electrode 51a and a rear electrode 51b are formed on the contact layer 41 and the rear surface of the substrate 1, respectively. The semiconductor laser wafer so produced is cleaved along the crystal planes 61 (first cleaving) to produce a plurality of bars, and each bar is cleaved along crystal planes perpendicular to the crystal plane 61 (second cleaving), whereby the wafer is divided into a plurality of individual semiconductor laser chips.

A description is now given of an allowable error between the mask pattern and the crystal axis in fabrication of a semiconductor laser.

Since a semiconductor laser is combined with optical systems, such as a lens or optical fiber, deviation of radiated beam becomes a problem. Generally, the allowable range of this deviation is±2°. Assuming that the refractive index of the waveguide $n_1$ is 3.5 and the refractive index of air $n_0$ is 1, the allowable error i between the cleavage plane and the mask pattern is obtained in the following equation using Snell's law:

$$n_1 \times \sin(i) = n_0 \times \sin(2°) \quad i = 0.57°$$

In this case, an error between the cleavage plane and the mask pattern within±0.5° is allowable.

On the other hand, in the fabrication of semiconductor laser chips, cleaving is indispensable, and the cleavage length is usually about 20 mm. If the cleavage length is too long, it is difficult to break the wafer. On the contrary, if it is too short, a smooth mirror surface cannot be obtained. In the following description, it is assumed that the cleavage length is 20 mm and the space 81 between electrodes of adjacent laser chips is 40 μm. Although the space 81 between the electrodes is desired to be narrower, the narrower the space 81 becomes, the narrower the allowable range of the error becomes. On the contrary, when the space 81 becomes larger, for example, when it exceeds 60 μm, an excess portion of the wafer between the electrodes becomes a saturable absorber, resulting in degradation in laser characteristics, such as an increase in thermal resistance.

Therefore, when the space 81 between the electrodes is 40 μm, the error angle θ between the electrode pattern and the crystal axis that enables cleaving of the wafer without intersecting the electrode pattern must be at least within a range of $\tan\theta \leq \pm 20$ μm/20 mm, i.e., $\theta \leq \pm 0.06°$. In order to realize this result, the error between the crystal axis of the wafer and the orientation flat must be smaller than 0.04°.

A description is given of the function and effect of this first embodiment.

Figure 3:
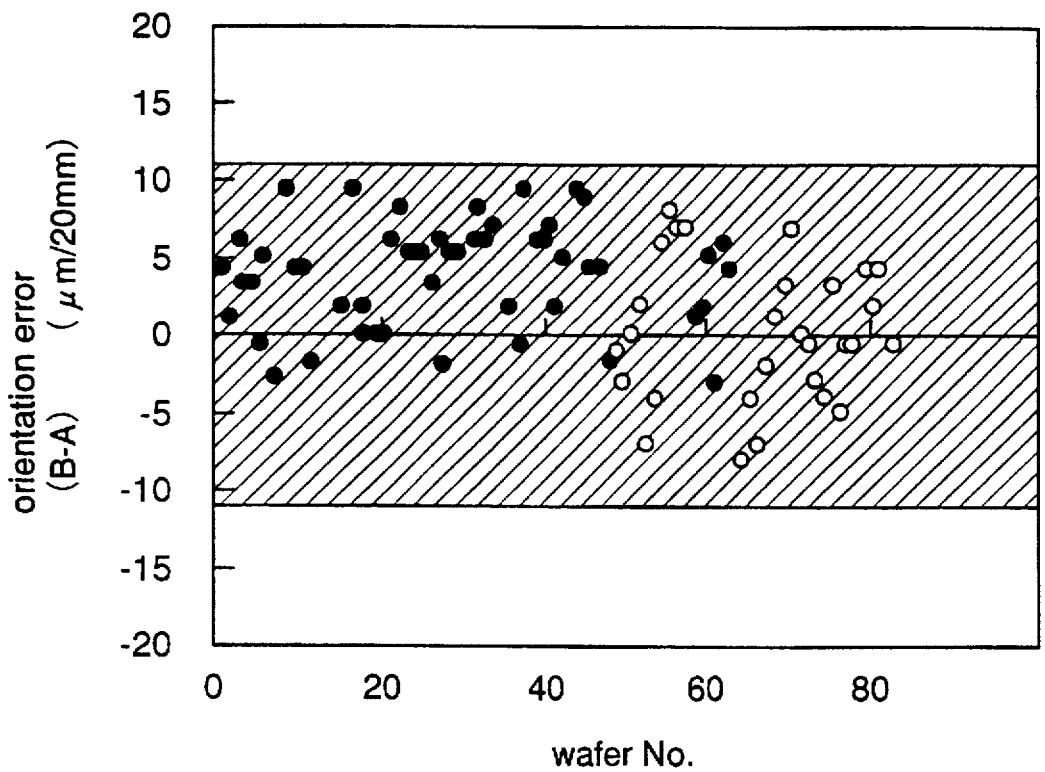
FIG. 3(a) is a diagram illustrating distributions of orientation errors between a crystal plane and a mask pattern when an orientation flat is formed by cleaving and when an orientation flat is formed according to the first embodiment of the invention.
FIG. 3(b) is a diagram for explaining measurement of the orientation error.
Figure 3:
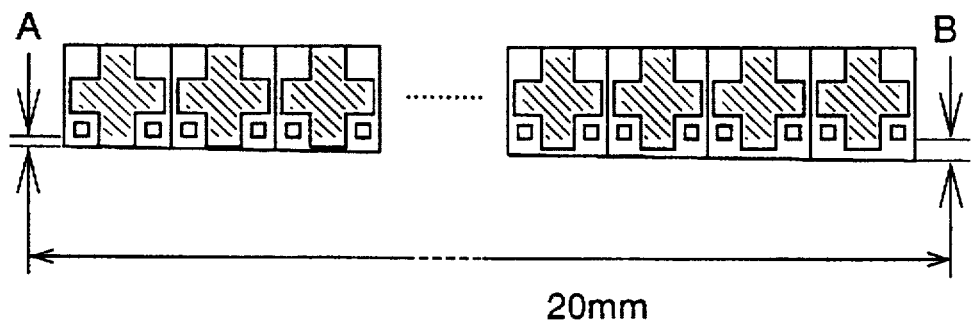

FIG. 3(a) is a diagram illustrating distributions of orientation errors between a crystal plane and a mask pattern when an orientation flat is formed by cleaving (●) and when an orientation flat is formed by the method according to the first embodiment of the invention (○). The ordinate shows the difference in the orientation errors between both ends of the cleavage length of 20 mm, i.e., B–A in FIG. 3(b), and the abscissa shows the number of the wafers. In FIG. 3(a), the hatched region is a region where the orientation error between the crystal plane and the mask pattern is within±0.03°.

In this first embodiment of the invention, since semiconductor laser chips are fabricated using the semiconductor wafer 1 in which the error between the orientation flat and the crystal plane is adjusted within±0.02° using X-ray diffraction, it is possible to keep the error of the mask pattern relative to the orientation flat within±0.03° by appropriately adjusting a prealignment mechanism for detecting the orientation flat included in an aligner (stepper or contact aligner) for exposing the pattern.

In this first embodiment of the invention, when the cleavage length is 20 mm and the space between the adjacent electrodes in the electrode pattern is 40 μm, a highly precise mask alignment that satisfies the allowable range of error is realized by the prealignment mechanism of the aligner alone, whereby semiconductor laser chips are produced with no misorientation of the electrode pattern in cleaving.

In Japanese Published Patent Application No. Hei. 1-16891 in which semiconductor laser chips are produced using a semiconductor wafer with an orientation flat formed by cleaving, about 65% of the wafer cracking is caused by the chipping of the orientation flat. On the other hand, in this first embodiment of the invention, no cracking occurs from the chipping of the orientation flat, and the wafer cracking is reduced to ⅕ of the prior art method.

As described above, according to the first embodiment of the present invention, since semiconductor laser chips are fabricated using a circular semiconductor wafer having an orientation flat that is mechanically formed by grinding or the like and then accurately adjusted using X-ray diffraction so that the error of the orientation flat from the crystal axis is within±0.02°, the error of a mask pattern alignment relative to a crystal axis can be within±0.03° by adjusting an alignment mechanism of an aligner. In addition, since the orientation flat is slightly rounded at the edges, even when it is subjected to repeated mechanical pressure, chipping of the wafer is reduced, resulting in a reduction in cracking of the wafer due to chipping. Further, since the length of the orientation flat is shorter than the length of the orientation flat formed by cleaving, unwanted falling of the wafer from a carrier due to deviation of the center of the wafer is reduced.

Therefore, in this first embodiment, it is possible to fabricate semiconductor laser chips using a circular wafer in the same automated processing apparatus as that used for fabrication of LSIs. As a result, the processing precision is improved and the device characteristics are made uniform.

Embodiment 2

Figure 4:
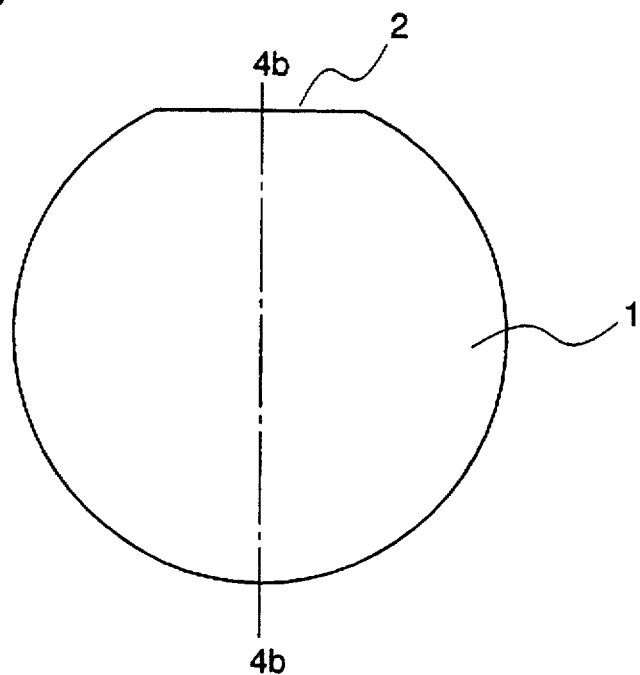
FIG. 4(a) is a plan view illustrating a wafer used for fabrication of semiconductor laser chips in accordance with a second embodiment of the present invention.
FIG. 4(b) is a part of a cross-sectional view taken along a line 4b—4b in FIG. 4(a).
Figure 4:
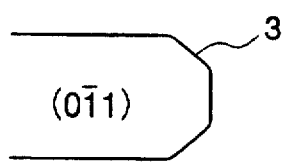

FIGS. 4(a) and 4(b) are diagrams for explaining a method of fabricating semiconductor laser chips in accordance with a second embodiment of the present invention, in which FIG. 4(a) is a plan view of a semiconductor wafer and FIG. 4(b) shows a part of a cross-sectional view taken along a line 4b—4b in FIG. 4(a). In these figures, the same reference numerals as those in FIGS. 1(a) and 1(b) designate the same or corresponding parts. Reference numeral 3 designates edges of the semiconductor wafer 1 at the orientation flat 2, which are chamfered using a mechanical method or a chemical method. The chamfer dimension is about 0.25 mmR.

In this second embodiment of the invention, semiconductor laser chips are fabricated using a semiconductor wafer having an orientation flat that is produced by spontaneous cleaving and upper and lower edges that are chamfered with a mechanical or chemical method.

Figure 5:
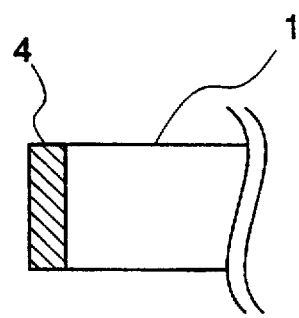
FIGS. 5(a)–5(b) are schematic diagram illustrating a chemical method for chamfering a semiconductor wafer.
FIG. 5(c) is a schematic diagram illustrating a mechanical method for chamfering a semiconductor wafer, according to the second embodiment of the present invention.
Figure 5:
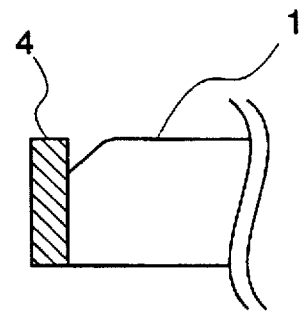
Figure 5:
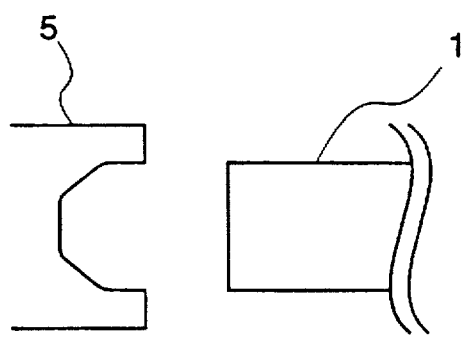

A description is given of mechanical and chemical methods of chamfering the edges of the semiconductor wafer. FIGS. 5(a) and 5(b) are schematic diagrams illustrating the chemical method, and FIG. 5(c) is a schematic diagram illustrating the mechanical method. In these figures, reference numeral 4 designates a protective film, such as a resist film, and numeral 5 designates a grindstone.

First of all, the chemical method will be described.

Usually, in the final step of producing a semiconductor wafer, the wafer is subjected to polishing with chemicals, that is, so-called mirror polishing. In this second embodiment of the invention, the mirror polishing is carried out with a protective film 4 on the peripheral side surface of the semiconductor wafer 1 as shown in FIG. 5(a). During this chemical treatment, the surface of the wafer is polished like a mirror and, simultaneously, the chemical penetrates between the protective film 4 and the side surface of the wafer, whereby the edge of the wafer is chamfered as shown in FIG. 5(b).

In the mechanical method shown in FIG. 5(c), a semiconductor wafer 1 is chamfered using a grindstone 5 having a groove that is engaged with the semiconductor wafer 1. Alternatively, a wafer size-adjusting machine, such as a grinder, for grinding a peripheral part of a wafer for adjusting the wafer size may be employed for the chamfering.

In order to make a 16 mm long orientation flat in a 2-inch wafer, the following technique may be employed. As described in BACKGROUND OF THE INVENTION, it is very difficult to form a 16 mm long orientation flat in a 2-inch wafer by cleaving. Therefore, using a 3-inch wafer, an orientation flat is formed in the 3-inch wafer and, thereafter, the wafer is ground at the periphery using the above-described wafer size-adjusting machine to reduce the wafer size to 2 inches and the length of the orientation flat to 16 mm.

Since the process steps for fabricating semiconductor laser chips using the semiconductor wafer prepared as described above are the same as those already described with respect to FIGS. 7(a)–7(f), repeated description is not necessary.

A description is now given of function and effect of the second embodiment of the invention.

In case of the first embodiment of the invention, a precision within±0.05° is required for the prealignment of the aligner. However, if this precision cannot be satisfied in the prealignment, the orientation flat must be formed by spontaneous cleaving. Since the orientation flat just after the cleaving has right-angled edges, when this orientation flat is subjected to mechanical press, chipping is easily produced in the wafer. In order to reduce the chipping, the edges of the orientation flat that is formed by cleaving are chamfered by about 0.25 mmR. A semiconductor wafer with such an orientation flat is used to realize a highly precise alignment of mask pattern. Further, even when this orientation flat is subjected to mechanical pressure repeatedly, no chipping is produced in the wafer, like the mechanically produced highly precise orientation flat according to the first embodiment, whereby unwanted cracking of the wafer due to chipping is avoided.

Furthermore, a semiconductor wafer with an orientation flat of a desired length can be obtained when an orientation flat is formed by cleaving in a large-sized wafer and, thereafter, the size of the wafer is reduced using a wafer size-adjusting machine.

According to this second embodiment of the present invention, since semiconductor laser chips are fabricated using a circular semiconductor wafer in which an orientation flat is formed by cleaving and upper and lower edges of the orientation flat are chamfered, a highly precise alignment of a mask pattern is achieved, and unwanted cracking of the wafer due to the chipping during the fabricating process is avoided.

Embodiment 3

In this third embodiment of the present invention, a description is given of a method of fabricating semiconductor laser chips using a semiconductor wafer which is thicker than conventional semiconductor wafers.

Initially, a semiconductor ingot is prepared. This semiconductor ingot is sliced into a plurality of semiconductor wafers each having a thickness larger than usual. While a conventional 2-inch Si wafer is about 350 µm thick, in this third embodiment an InP wafer 400–600 µm thick is employed for fabrication of semiconductor laser chips.

Since the process steps for fabricating the laser structure in the wafer are identical to those already described with respect to FIGS. 7(a)–7(f), repeated description is not necessary.

A description is given of function and effect of this third embodiment.

Figure 9:
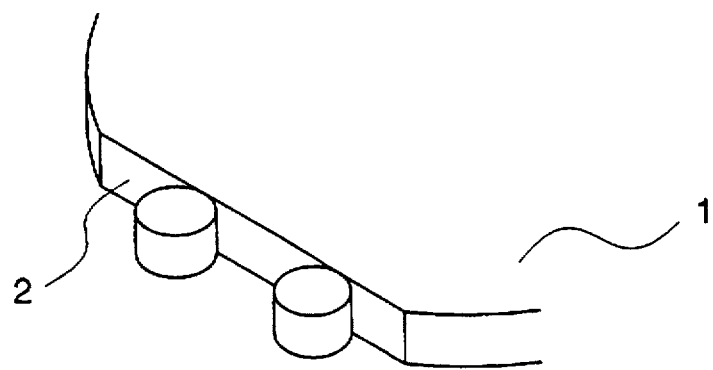
FIG. 9(a) is a perspective view illustrating an orientation flat detecting method.
FIG. 9(b) is a plan view of a semiconductor wafer in which chipping is produced due to repeated detection of the orientation flat.
Figure 9:
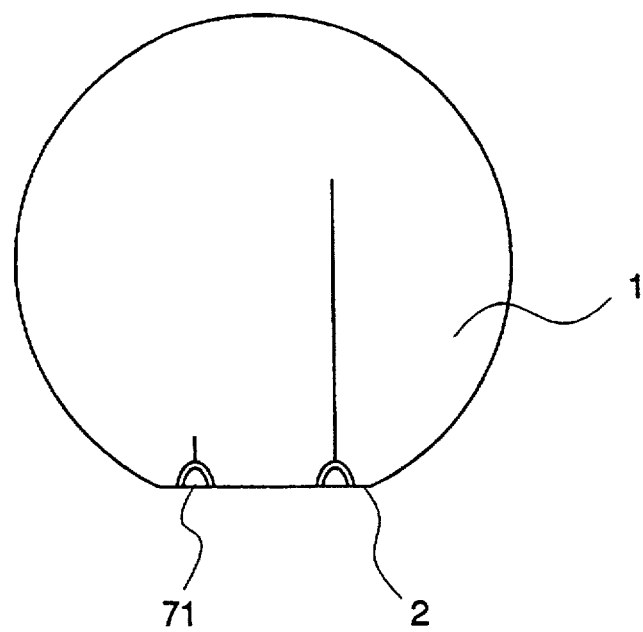

Since a semiconductor wafer used for fabrication of semiconductor laser chips, such as an InP or GaAs wafer, is cleavable, it is easily cleaved along a crystal orientation from the chipping 71 which is naturally produced in the wafer during the fabricating process as shown in FIG. 9(b). Therefore, an InP or GaAs wafer is easier to crack than an Si wafer. The unwanted cracking of the semiconductor wafer due to chipping can be prevented by increasing the thickness of the wafer. In addition, a thick semiconductor wafer is easily obtained by increasing the thickness of the wafer when it is sliced from the semiconductor ingot. Usually, before separation of a wafer into chips, the wafer is ground at the rear surface to reduce the thickness of the wafer to about 100 µm. In this third embodiment of the invention, the increased thickness, i.e., excessive thickness, of the semiconductor wafer can be reduced in this grinding step.

As described above, according to the third embodiment of the present invention, since semiconductor laser chips are fabricated using a relatively thick semiconductor wafer, unwanted cleaving of the wafer due to the chipping is avoided, whereby the wafer is prevented from cracking during the laser fabrication process.

Embodiment 4

A fourth embodiment of the present invention relates to a method of fabricating semiconductor laser chips using a semiconductor wafer according to any of the first to third embodiments of the invention, wherein numbering is given to the rear surface of the wafer using a laser marker.

After fabrication of the semiconductor wafer according to any of the first to third embodiments, the semiconductor wafer is numbered at the rear surface using a laser marker, and semiconductor laser chips are fabricated using the numbered semiconductor wafer. The process steps for fabricating the semiconductor laser chips in the semiconductor wafer are identical to those already described with respect to FIGS. 7(a)–7(f) and, therefore, repeated description is not necessary.

A description is given of function and effect of this fourth embodiment.

Since the semiconductor wafer has a number at the rear surface, the wafer is easily distinguished from other wafers during the fabricating process. In addition, discrimination between front and rear surfaces of the wafer that is usually performed using a second orientation flat, and detection of the orientation of the wafer can be performed using the number on the rear surface of the wafer.

In a semiconductor wafer used in an automated production line system, a second orientation flat for discriminating between front and rear surfaces of the wafer and shorter than the first orientation flat for mask alignment is formed at a position perpendicular to the first orientation flat.

In this fourth embodiment of the invention, the second orientation flat can be dispensed with because the number given to the rear surface of the semiconductor wafer is used in place of the second orientation flat. In this case, since the number on the rear surface of the semiconductor wafer is detected using an optical detector, i.e., without contacting the wafer, chipping is hardly produced in the wafer, so that unwanted cracking of the wafer is avoided. In addition, malfunctioning of the detector, i.e., misdetection between first and second orientation flats, is avoided. Therefore, regardless of the detecting means, a highly precise prealignment is achieved. Further, since the second orientation flat is dispensed with, the process of fabricating the wafer is simplified. Especially when the orientation flat is formed by cleaving as in the second embodiment of the invention, the fabrication process is significantly facilitated because it is very difficult to make a short orientation flat by cleaving.

According to this fourth embodiment of the present invention, since the semiconductor wafer is numbered at the rear surface using a laser marker, discrimination of the semiconductor wafer from other wafers and discrimination between front and rear surfaces of the wafer during the fabricating process are facilitated. Further, since the second orientation flat for discriminating between front and rear surfaces of the semiconductor wafer is dispensed with, the fabricating process of the semiconductor wafer is simplified. In addition, malfunction-ing of the detector, i.e., misdetection between the first and second orientation flats, is avoided.

What is claimed is:

1. A method of fabricating semiconductor laser chips using a circular compound semiconductor wafer, the circular compound semiconductor wafer comprising a crystalline compound semiconductor having a crystalline axis, having a front surface and a peripheral side surface perpendicular to the front surface, the method comprising:

forming an orientation flat at a part of the peripheral side surface, wherein the orientation flat is oriented with resect to the crystalline axis within an error of±0.04°;

forming a mask pattern for semiconductor laser on the circular compound semiconductor wafer so that the mask pattern is aligned with respect to the crystalline axis within an error of ±0.06°;

using the mask pattern, fabricating a plurality of semiconductor lasers on the circular compound semiconductor wafer; and dividing the circular compound semiconductor wafer into a plurality of individual semiconductor laser chips by cleaving the circular compound semiconductor wafer.

2. The method of claim 1 including:

forming the orientation flat of the circular compound semiconductor wafer by mechanically grinding or polishing a part of the peripheral side surface of the circular compound semiconductor wafer; and adjusting orientation of the orientation flat using X-ray diffraction so that the orientation flat is oriented with respect to the crystalline axis within the error of±0.04°.

3. The method of claim 1 wherein the circular compound semiconductor wafer is InP and has a diameter of 2 inches and a thickness in a range from 400 μm to 600 μm.

4. The method of claim 1 including applying an identifying mark to the circular compound semiconductor wafer using a laser marker.

5. A method of fabricating semiconductor laser chips including:

- forming an ingot of a single crystal compound semiconductor material from which semiconductor lasers can be prepared, the ingot having a circular cross-section;
- grinding a first planar surface along the ingot, the first planar surface having a width smaller than a target width of an orientation flat;
- determining the crystalline orientation of the first planar surface by X-ray diffraction;
- adjusting, if necessary, the orientation of the ingot and further grinding the ingot at the first planar surface, forming a subsequent planar surface with a width larger than the width of the first planar surface;
- repeating the steps of determining and adjusting until the width reaches the target width of the orientation flat;
- slicing the ingot transverse to the first planar surface to produce a wafer having an orientation flat aligned with respect to a crystalline axis of the wafer within an error of±0.04°;
- forming a mask pattern for semiconductor lasers on the compound semiconductor wafer so that an alignment error of the mask pattern with respect to the crystalline axis is within±0.06°;
- using the mask pattern, fabricating a plurality of semiconductor lasers on the compound semiconductor wafer; and
- dividing the compound semiconductor wafer into a plurality of individual semiconductor laser chips by cleaving the compound semiconductor wafer.

6. The method of claim 5 wherein the compound semiconductor material is InP and including slicing the ingot of InP to produce a wafer having a nominal diameter of 2 inches and a thickness of 400 μm to 600 μm.

7. A method of fabricating semiconductor laser chips including:

- forming an orientation flat on a compound semiconductor wafer of a compound semiconductor material from which semiconductor lasers can be prepared, the compound semiconductor wafer having front and rear surfaces, by spontaneous cleaving to form a peripheral side surface perpendicular to the front and rear surfaces as the orientation flat;
- chamfering an edge of the compound semiconductor wafer between the front surface and the peripheral side surface, at the orientation flat, mechanically or chemically;
- forming a mask pattern for semiconductor lasers on the compound semiconductor wafer so that the mask pattern is aligned with respect to the crystalline axis within an error of±0.06°;
- using the mask pattern, fabricating a plurality of semiconductor lasers on the compound semiconductor wafer; and
- dividing the compound semiconductor wafer into a plurality of individual semiconductor laser chips by cleaving the compound semiconductor wafer.

* * * * *

UNITED STATES PATENT AND TRADEMARK OFFICE
CERTIFICATE OF CORRECTION

PATENT NO. : 5,763,290
DATED : June 9, 1998
INVENTOR(S) : Nakajima

It is certified that error appears in the above-identified patent and that said Letters Patent is hereby corrected as shown below:

Column 10, Line 51, change "resect" to --respect--;

Line 51, change "of±0.04°" to --of ±0.04°--;

Line 52, change "laser" to --lasers--;

Column 11, Line 3, change "of±0.04° to --of ±0.04°--;

Line 29, change "of±0.04°" to --of ±0.04°--;

Line 33, change "within±0.06°" to --within ±0.06°--;

Column 12, Line 27, change "of±0.06°" to --of ±0.06°--;

UNITED STATES PATENT AND TRADEMARK OFFICE
CERTIFICATE OF CORRECTION

PATENT NO. : 5,763,290
DATED      : June 9, 1998
INVENTOR(S): Nakajima

It is certified that error appears in the above-identified patent and that said Letters Patent is hereby corrected as shown below:

Abstract, Line 6, change "within±0.04° to

--within ±0.04°--.

Signed and Sealed this

Seventeenth Day of November, 1998

Attest:

BRUCE LEHMAN

Attesting Officer    Commissioner of Patents and Trademarks